(12) United States Patent
Boni

(10) Patent No.: US 9,426,556 B2
(45) Date of Patent: Aug. 23, 2016

(54) HEADPHONES WITH INCREASED SECURITY AND TRIPLE FUNCTION WITH ADAPTABLE EQUALIZATION

(71) Applicant: BLUEGAN S.R.L., Reggio Emilia (IT)

(72) Inventor: Angelo Boni, Reggio Emilia (IT)

(73) Assignee: BLUEGAN S.R.L., Reggio Emilia (IT)

( * ) Notice: Subject to any disclaimer, the term of this patent is extended or adjusted under 35 U.S.C. 154(b) by 0 days.

(21) Appl. No.: 14/400,983

(22) PCT Filed: May 9, 2013

(86) PCT No.: PCT/IB2013/053748
§ 371 (c)(1),
(2) Date: Nov. 13, 2014

(87) PCT Pub. No.: WO2013/171635
PCT Pub. Date: Nov. 21, 2013

(65) Prior Publication Data
US 2015/0146880 A1    May 28, 2015

(30) Foreign Application Priority Data
May 17, 2012 (IT) ............................... RE2012A0039

(51) Int. Cl.
| H04R 1/10 | (2006.01) |
| H03G 5/16 | (2006.01) |
| H04R 5/033 | (2006.01) |
| B60Q 1/26 | (2006.01) |

(52) U.S. Cl.
CPC ............ H04R 1/1041 (2013.01); H03G 5/165 (2013.01); H04R 1/1008 (2013.01); H04R 1/1016 (2013.01); H04R 1/1066 (2013.01); B60Q 1/2676 (2013.01); H04R 5/033 (2013.01); H04R 2430/01 (2013.01); H04R 2460/13 (2013.01)

(58) Field of Classification Search
CPC .. H01R 1/1008; H01R 1/1041; H01R 5/033; H01R 1/1075; H01R 1/1016; H01R 1/1091; H01R 2460/13; H01R 1/10; H01R 5/0335
USPC .......................... 381/74, 370, 151, 380, 374
See application file for complete search history.

(56) References Cited

U.S. PATENT DOCUMENTS

| 5,197,332 A | * | 3/1993 | Shennib | A61B 5/121 600/559 |
| 2002/0059008 A1 | * | 5/2002 | Wood | H04R 5/02 700/94 |
| 2008/0260193 A1 | | 10/2008 | Westermann et al. | |
| 2008/0279409 A1 | * | 11/2008 | Hupkes | H04R 1/1066 381/370 |
| 2009/0060231 A1 | | 3/2009 | Buroojy | |
| 2009/0086996 A1 | * | 4/2009 | Bongiovi | H03G 7/007 381/106 |
| 2010/0272272 A1 | | 10/2010 | Muller et al. | |

* cited by examiner

Primary Examiner — Akelaw Teshale
(74) Attorney, Agent, or Firm — Pearne & Gordon LLP

(57) ABSTRACT

Enhanced safety headphones for listening to audio and music, wherein the wearer decides the degree of sound isolation desired, i.e. audio via bone conduction (no isolation from the surrounding environment), in-ear earpiece (medium isolation from ambient noise), or earpieces covering the outer ear (high isolation from ambient noise). By connecting the preselected adaptor, one will obtain automatic volume adjustment and sound equalization, necessary for an optimal listening result under all conditions. A single product will thus be able to cover three different operating requirements. When worn on bicycles, skis or scooters, an indicator light will warn other circulating vehicles of the user's presence (position light). An acceleration sensor will signal any braking (stop light).

8 Claims, 6 Drawing Sheets

5A

5B

5C

HEADPHONES WITH INCREASED SECURITY AND TRIPLE FUNCTION WITH ADAPTABLE EQUALIZATION

Headphones for listening to music and for audio communication have reached a noteworthy level of technology, have an excellent audio output and are light to wear. Some of them are wireless and rely on Bluetooth or similar protocols for audio transmission. Headphones can be worn in a plurality of environments: at home to listen to music or the television, at work to answer phone calls while keeping one's hands free, in parks or in the gym for those who go jogging or do athletics, just to mention some uses. Finally, they can be worn on the road by pedestrians as well as cyclists and motorcyclists, not only to listen to music, but also to keep connected with friends in their group. They can be worn in cars to answer phone calls, and so on.

Depending on the situation of use, it may be necessary, or simply comfortable, for the headphones to largely isolate from the ambient noise, for example if one is listening to music or a phone call in a noisy environment, such as a home with children, a bar or an amusement arcade. However, there exist conditions in which the headphones must not block out external noises, for example in a busy street where the wearer must pay careful attention to traffic noises in order to ensure maximum safety. Finally, there is an intermediate condition in which the noises from the environment are only partially attenuated by the headphones, such as, for example, in an office, where the wearer must be able to listen to phone calls without excessive noise, but must likewise also be able to hear co-workers calling him/her.

To make headphones specific to each of the three above-mentioned conditions, different construction technologies are used:

1) Bone conduction, for headphones that must leave the ears completely free. Sound is thus transmitted via the bone structure and the transducer is placed next to the ears. The acoustic coupling is not very efficient, and a considerable acoustic power is necessary for an adequate listening level. Basses are usually attenuated because bothersome (perceived as a vibration against the head). As the ears remain free, no sound isolation is present, so that anyone wearing bone conduction headphones can completely perceive the sounds around him/her.
2) In-ear headphones for medium isolation from the surrounding environment. The acoustic efficiency is excellent and only low acoustic power is required thanks to the direct acoustic coupling with the ear. It is necessary to limit the coupled acoustic power, because otherwise damage can be caused to the ear.
3) Headphones totally covering the outer ear in order to have a high degree of sound isolation. In this case the acoustic coupling is good and the acoustic output necessary is medium relative to the two preceding cases.

Headphones thus differ mechanically and electrically to obtain the desired results in the categories listed above.

A user who needs to listen to music and/or speaking will have to possess different headphones depending on the operating condition.

In the past this was not a problem, since wired headphones were kept in the home and at the place of work. For portable use, on the contrary, wired in-ear headphones were used. With the advent of Bluetooth technology, headphones have become interoperable at home (HI-FI), at work (computer) and outside (palmtop, navigator, mobile phone, MP3 and interphone).

It is difficult to believe that users will buy three different headphones for different uses; they will generally buy an intermediate product (case 2) which can cover all the solutions, albeit not in an optimal manner. The biggest problem is safety, because outdoors (busy streets, stations, car parks), wearing headphones with even partial sound isolation is dangerous.

The purpose of the present invention is to realize headphones capable of functioning in the three operating modes provided for with a simple replacement of the part interfacing with the ear. A connected device will provide for equalization of the audio with respect to frequency response and volume to assure maximum listening comfort under the different operating conditions. Since the headphones are wireless and fitted with an internal battery, intrinsic safety can be further improved by using LED illumination, to be activated in situations of danger for the wearer. By way of example, the wearer can turn on a light so as to be recognized in conditions of darkness, poor visibility, etc. Moreover, a cyclist, skater or skateboarder can turn on not only this position light, but also a stop light, which will go on when the wearer decelerates.

The position light and stop light can use the same lighting means (LED for example), which lights up at two different brightnesses so as to give the same indication as a car or motor vehicle, but using only a single lighting means.

Said safety options can be particularly useful when the user is wearing bone conduction earpieces, since in this condition the user is presumably in a more dangerous environment (street, square, car park, etc.). The preferential use of said safety lighting will thus be connected to the wearing of bone conduction earpieces or, at most, to in-ear earpieces with medium isolation. This safety lighting will not, as a rule, be useful when covering earpieces are worn, since this is presumably a static use (sofa, armchair, home, office). The activation of the safety lighting will preferably be coupled to the type of earpiece connected to the headphones.

DESCRIPTION OF THE INVENTION

Figure 1:
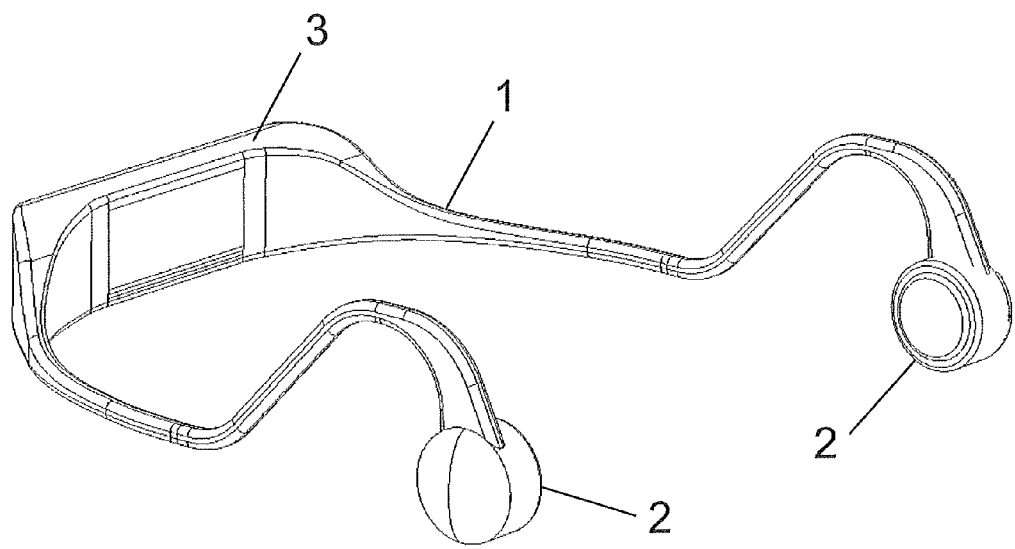
FIG. 1 shows a drawing of commercially available wireless bone conduction headphones.
Figure 1:
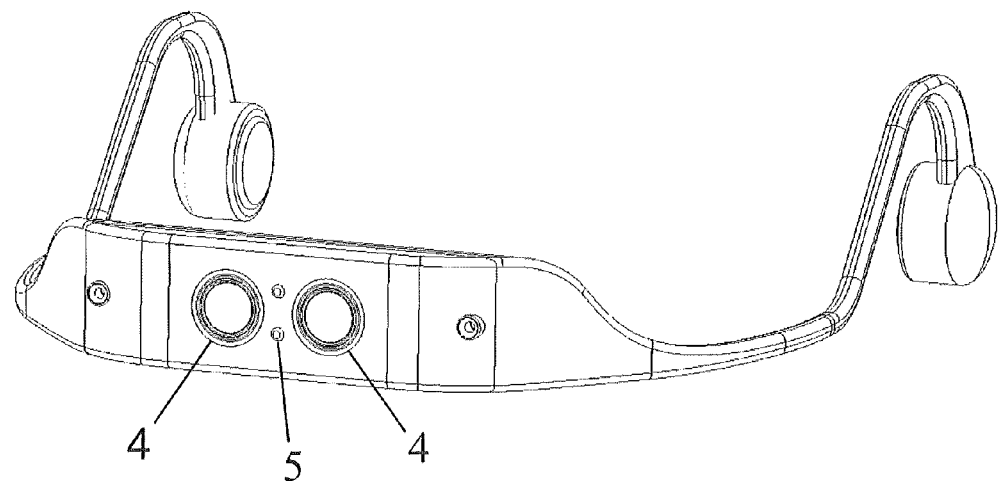

FIG. 1 shows a drawing of commercially available wireless bone conduction headphones with radio transmission. The body (1) is made of plastic material, the earpieces are housed in respective niches (2), shaped so as to rest next to the ears. The resting part (3) situated at the rear of the structure rests on the base of the neck, so that its weight will not bear on the wearer's ears. Housed inside the resting part (3) there is a battery and an electronic control card, which is capable of connecting via radio (for example by Bluetooth) to the audio devices to be interconnected. Usually, in the rear part there are one or two buttons (4) for on/off switching and volume adjustment. One or more LEDs (5) are provided to indicate the product's operating status (on, off, battery low).

Figure 2:
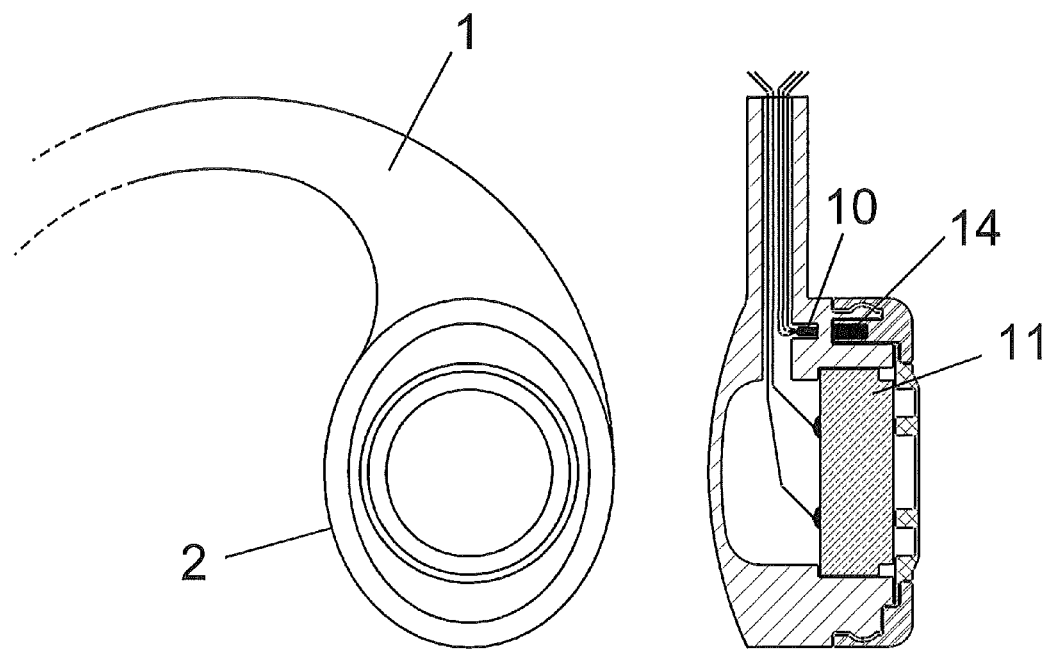
FIG. 2 shows headphones according to the present invention, with bone conduction earpieces.
Figure 2:
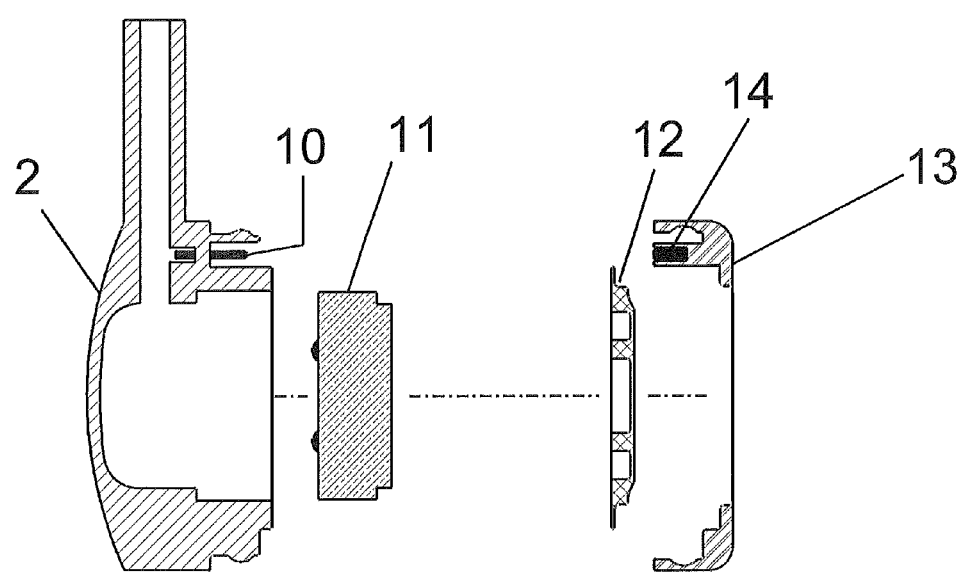
Figure 5:
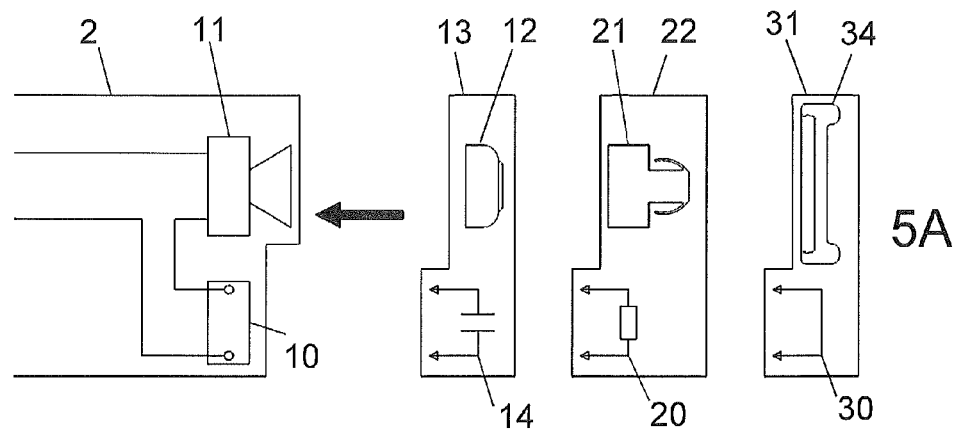
FIGS. 5A, 5B, 5C show respective versions of an equalization circuit according to the present invention.
Figure 5:
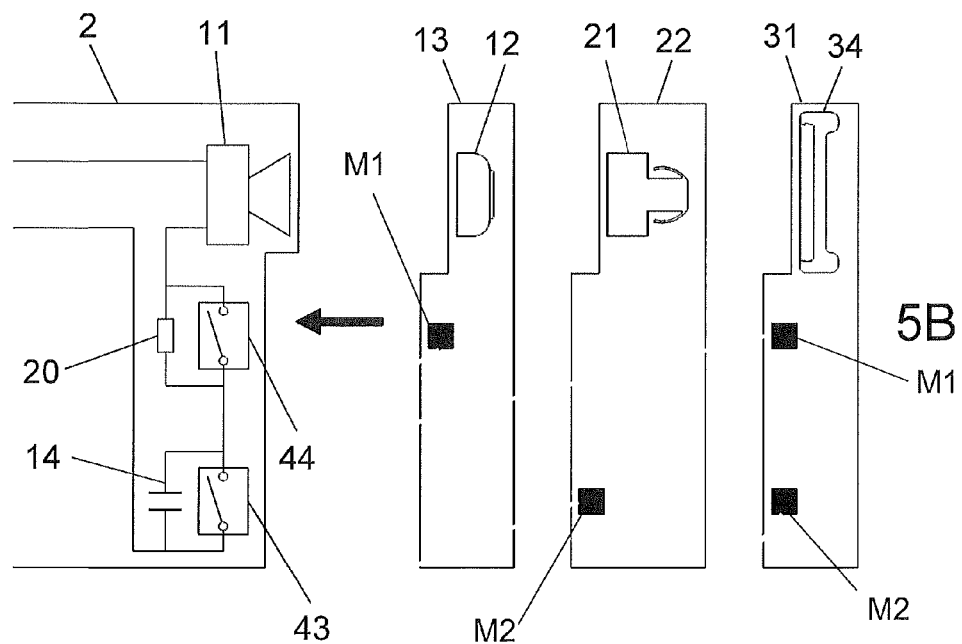
Figure 5:
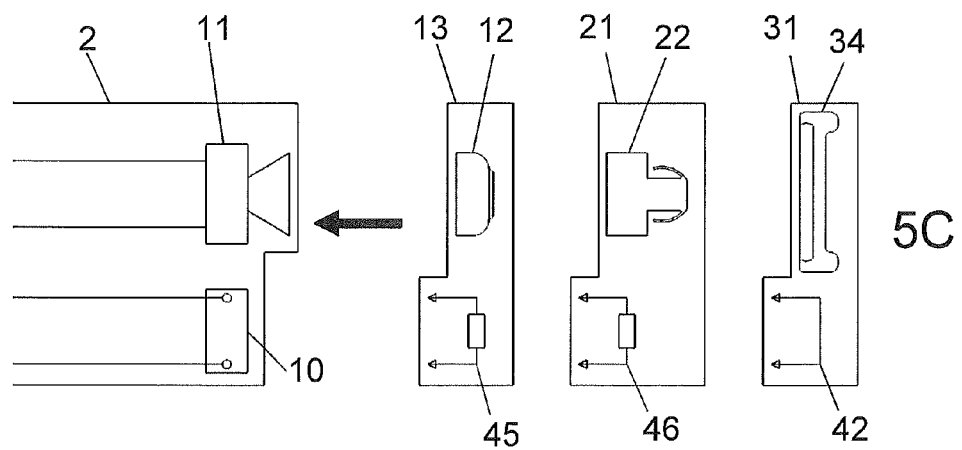

The invention is illustrated in FIG. 2, in a version with bone conduction earpieces. The headphones comprise a removable earpiece or front part (13). An equalization circuit (14), illustrated in detail further below in FIG. 5, is solidly joined to the front part (13). Said circuit (14) is configured to be coupled to a connector (10), contained in a niche (2) of the headphones, in such a way as to close the circuit of a loudspeaker (11). Solidly joined to the front part of the headphones (13) there is a membrane (12), configured to interface the audio path between the loudspeaker (11) and the front part (13) in contact with the wearer's head.

Figure 3:
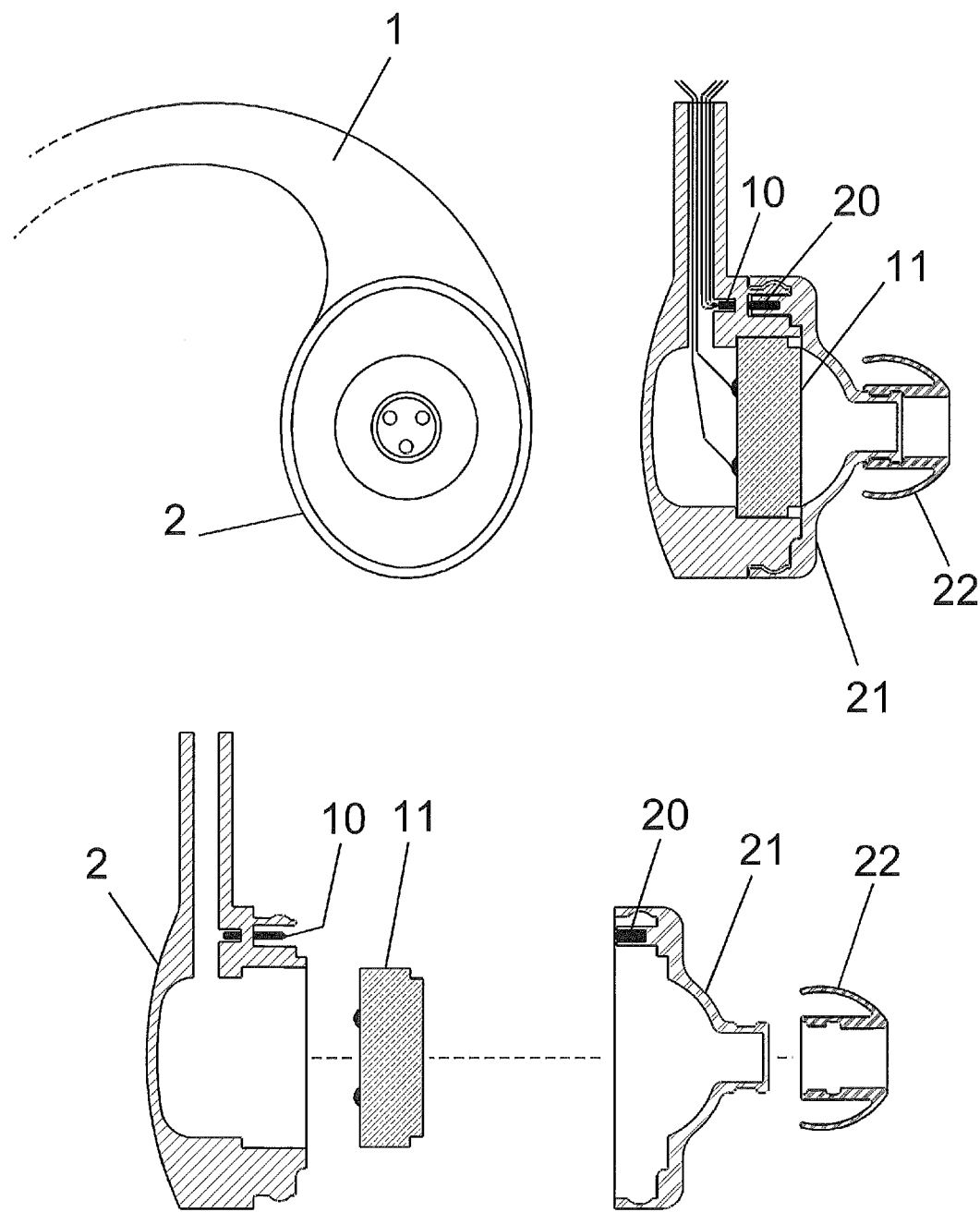
FIG. 3 shows headphones according to the present invention, with earpieces adapted to be placed inside the ear.

The front part (13), together with the circuit (14) and membrane (12) are removable together in order to be replaced by an earpiece to be placed inside the ear, illustrated in FIG. 3. In this case the earpiece (21, 22) is placed on the niche (2) and is capable of adapting to the inner ear. Said earpiece (21, 22) is provided with an equalization circuit (20), configured to couple to the connector (10), solidly joined to the niche (2) of the headphones, so as to close the loudspeaker circuit (11) in order to optimize the audio performance in this type of application as well. The set comprising the equalization circuit (20) and earpiece (21, 22) form the complete extractable adaptor for an internal earpiece.

Figure 4:
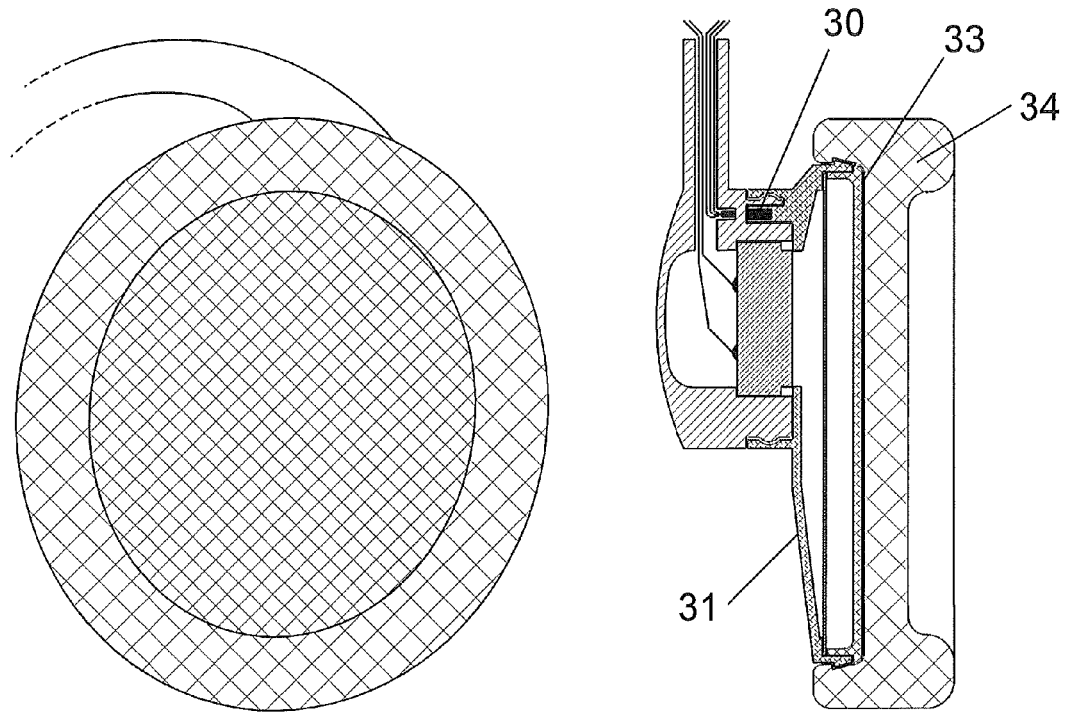
FIG. 4 shows headphones according to the present invention, with earpieces as isolating covers for the outer ear.
Figure 4:
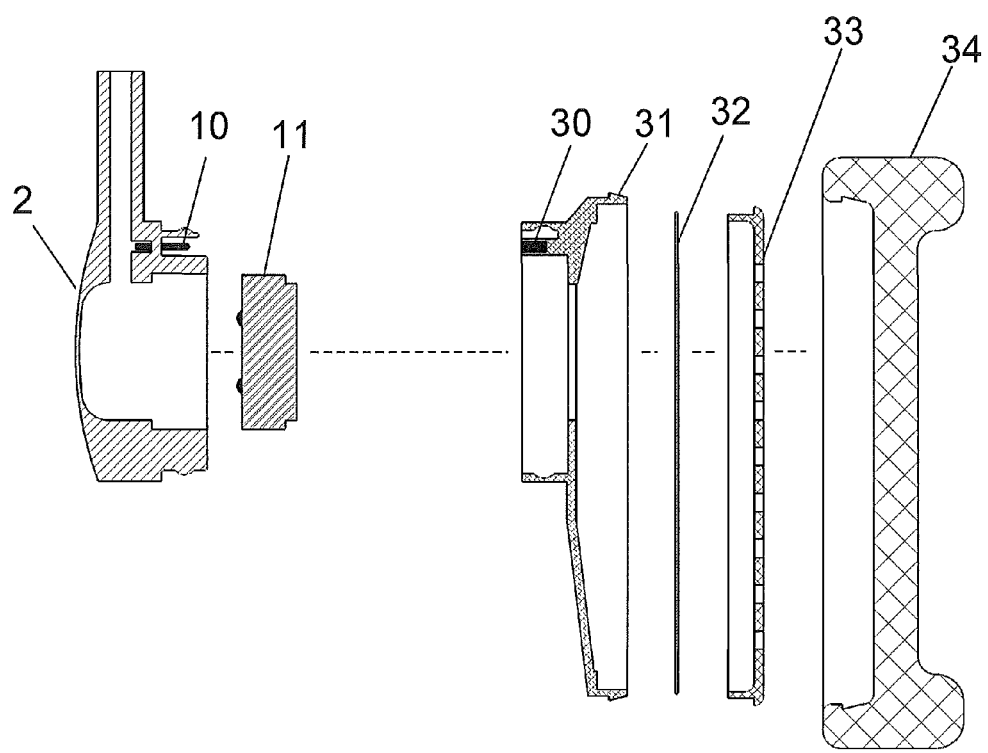

FIG. 4 illustrates a version with an earpiece as an isolating cover of the outer ear. In this version the earpiece comprises a connection interface (31) configured to be removably connected to the niche (2) of the headphones and the loudspeaker (11). The earpiece further comprises a membrane (32) and a cover (33) configured to conduct audio to the wearer's ear. The earpiece further comprises an equalization circuit (30) configured to be coupled to the connector (10) contained in the niche (2) of the headphones so as to close the loudspeaker circuit (11), with the aim of optimizing the audio performance in this type of application as well. The membrane (32), the cover (33) and the equalization circuit (30) determine the listening characteristics. The earpiece further comprises a front part (34) made of soft material, which is configured to surround the outer ear and provide sound isolation.

FIG. 5 represents the equalization circuits in greater detail.

In the case of FIG. 5A, the equalization circuit comprises a capacitor (14) for bass cut in the case of bone conduction, a resistor (20) to lower the available power in the case of the in-ear earpieces (to equalize the volume and protect the ear from excessively high powers), and a direct connection jumper (30) in the case of the headphones covering the outer ear, which can thus exploit the maximum dynamics and the complete audio band.

FIG. 5B illustrates a different embodiment of the equalization circuit. In this embodiment the equalization circuit comprises a capacitor (14) and a resistor (20) connected in series to the loudspeaker (11). A first and a second magnetic switch (43, 44) are disposed in parallel to the capacitor (14) and resistor (20).

Small magnets (M1, M2) are positioned in the removable earpieces and disposed in such a way as to be able to abut one or both of the magnetic switches (43, 44).

By inserting only one magnet (M1) in a position such as to close the second switch (44), but not the first switch (43), it is possible to obtain the connection of the capacitor (14) in order to cut bass for the bone conduction version.

On the other hand, by inserting only one magnet (M2) in a position such as to activate the first switch (43), but not the second switch (44), it is possible to obtain the circuit equivalent to the case of the in-ear earpieces, with the resistor (20) that limits the audio power.

By inserting both magnets (M1, M2) it is possible to determine the closure of both magnetic switches (43, 44), so that the circuit is substantially identical to the one necessary for the headphones covering the outer ear. The circuits exemplified thus far with a single component can take on more complex forms, characterized by R, L and C components connected in series and in parallel, corresponding to known equalization circuits usable in the event of further refinement of the audio response, without going beyond the scope of the invention.

In FIG. 5C it is assumed that an equalization system external to the headphones is available, in particular a DSP system or an analogue or digital equivalent thereof. In this case it is not necessary to equalize the audio signal directly on the headphones, but rather it is sufficient to notify the DSP of the type of headphones connected. By way of example, the connector (10) of FIG. 5C can interface with a resistor (45) of a known value, or with a resistor (46) of a different value, or else with a direct connection (42).

The equalization circuit is capable of reading the input value and generating a corresponding audio response. The communication method between the DSP and headphones can be different from the examples given thus far, without going beyond the scope of the invention. By way of example, other passive components, such as capacitors or inductors, can be used to code the movable parts of the headphones. It is also possible to use active elements, such as integrated circuits for serial communication, digital memories, etc. The number of wires used in the communication can vary from zero (using the same wires that carry the audio) to a high number, for example 8 or 16, to set up parallel communication.

Alternatively, it will be possible to manually program the preferred equalization based on the type of earpiece or headphones selected. By way of example, the additional buttons (51) of FIG. 6 can also serve this purpose.

Figure 6:
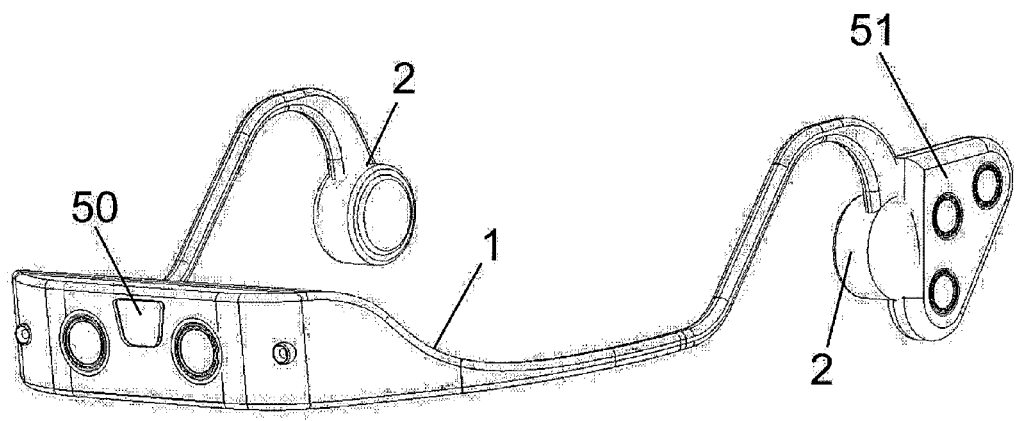
FIG. 6 shows headphones according to the present invention, having an indicator, lighting and stop LED.
Figure 6:
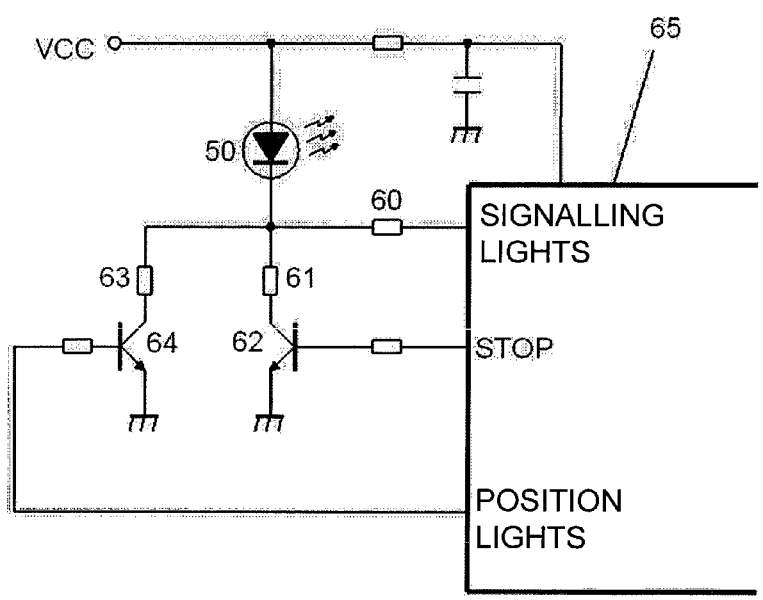

FIG. 6 also shows an indicator, lighting and stop LED (50). The main function is to indicate the headphone status (on, off, stand-by) to the wearer and these signals are produced at a low brightness of the LED, by means of a resistor (60) that allows the flow of a small amount of current, typically 2 to 5 mA, which a processor (65) applies directly to the LED (50). The auxiliary stop light function is obtained by delivering the maximum operating current (for example 150 mA) to the LED (50), so that it lights up at maximum brightness. A transistor (62) receives a stop command, which is sent by a deceleration sensor (an MEMS accelerometer or inertial switch, for example) known in the prior art and not described in detail here. Said transistor (62) activates the resistor (61), which allows the maximum admissible current to flow in the LED (50).

If, on the other hand, there is a need for a position or visibility light, or whatever one wishes to call it, the LED (50) will remain steadily lit at an intermediate current, between the minimum (5 mA) and the maximum (150 mA). By way of example, 30 mA could be an optimal current value for making the LED (50) visible from afar, while still allowing a good increase in brightness for the stop function. This additional intermediate current is obtained by means of a resistor (63) activated by a transistor (64), which is in turn activated by the "position light" signal coming from the processor present on the card or via a manual command sent, for example, by means of buttons (51) of FIG. 6.

The invention claimed is:

1. Enhanced safety headphones, comprising:

two niches (2) with earpieces that can be interchanged by the wearer as desired;

characterized in that it comprises:

a loudspeaker (11) disposed inside each niche (2);

at least two different pairs of earpieces, to be used according to different operating conditions, where no, medium or high sound isolation is necessary, said at least two different pairs of earpieces being chosen among:

two bone conduction earpieces, each of which comprises a front part (13), a first equalization circuit (14) capable of connecting to a connector (10), and a first membrane (12), wherein the circuit (14) is capable of equalizing the audio listened to by eliminating bass tones;

each earpiece is removably connectable to a respective niche (2) and to the loudspeaker (11);

two earpieces to be placed at least partially inside the ear, each of which comprises an external structure (21) provided with a second equalization circuit (20) capable of being connected to the connector (10), and an adaptor (22) made of soft material capable of adapting to the ear canal; the circuit (20) is capable of reducing the output audio level to values ensuring the safety of the ear;

each earpiece is removably connectable to a respective niche (2) and to the loudspeaker (11);

two earpieces covering the outer ear, each of which comprises an external structure (34) made of soft material capable of resting on the outer ear, a connection interface (31), configured to be removably connected to a niche (2), a second membrane (32), a cover (33) and a third equalization circuit (30), configured to be connected to the connector (10) and achieve a predetermined equalization of the audio;

each earpiece is removably connectable to a respective niche (2) and to the loudspeaker (11).

2. Enhanced safety headphones according to claim 1, comprising: a LED (5) for generically signalling the operation of the headphones, configured to be used also as a position light and stop light, said LED (5) being of the high brightness type (50);

a first component (60) connected to a processor (65) for indicating the operating statuses of the system using a lower brightness;

a second and a third component (63, 64), connected to the processor (65), configured to determine an intermediate brightness of the LED (50) as a position light;

a third and a fourth component (61, 62), connected to the processor (65) and an adjustable accelerometer, configured to determine a maximum brightness of the LED (50) as a stop light.

3. Enhanced safety headphones according to claim 2, characterized in that the brightness of the LED (50) is a function of the ambient lighting, and the processor (65) adjusts three thresholds, indicator, position and stop, in relation to the ambient lighting;

the processor (65) is configured to switch on the position light automatically when the ambient lighting falls below a certain level set by the user.

4. Enhanced safety headphones according to claim 1, characterized in that the first, the second and the third equalization circuit comprise at least a respective functional element (14, 20, 30), connectable to the connector (10).

5. Enhanced safety headphones according to claim 4, comprising:

a first and a second magnetic switch (43, 44), configured to activate at least one functional element (14, 20);

at least two magnets (M1, M2), associated with the earpieces in such a way as to activate one or both magnetic switches (43, 44);

the bone conduction earpieces comprise a first magnet (M1) positioned in such a way as to activate the second magnetic switch (44) and connect a first functional element (14);

the earpieces to be positioned in the ear canal comprise a second magnet (M2) positioned in such a way as to activate the first magnetic switch (43) and connect a second functional element (20);

the covering earpieces comprise two magnets (M1, M2) positioned in such a way as to activate both magnetic switches (43, 44) so as to disconnect both functional elements (14, 20).

6. Enhanced safety headphones according to claim 1, comprising an audio processor, configured to achieve equalization of the audio signal, and a resistor (45, 46, 42) associated with each earpiece, said audio processor being configured to send a control signal to the resistor (45, 46, 42) via the connector (10) and achieve a given equalization depending on the resistor (45, 46, 20) that is connected.

7. Enhanced safety headphones according to claim 6, comprising a logical device in place of the resistor (45, 46, 42), configured to send the control signal to the audio processor.

8. Enhanced safety headphones according to claim 7, characterized in that the logical device connects to the audio processor using the same wires that carry audio to the loudspeaker.

* * * * *